United States Patent
Saied et al.

(10) Patent No.: US 8,423,927 B2
(45) Date of Patent: Apr. 16, 2013

(54) SIMULATION OF THE IMAGE PROJECTED BY A MASK

(75) Inventors: Mazen Saied, Meylan (FR); Emek Yesilada, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 323 days.

(21) Appl. No.: 12/839,817

(22) Filed: Jul. 20, 2010

(65) Prior Publication Data

US 2011/0022219 A1    Jan. 27, 2011

(30) Foreign Application Priority Data

Jul. 21, 2009   (FR) ...................................... 09 55082

(51) Int. Cl.
 *G06F 17/50* (2006.01)

(52) U.S. Cl.
 USPC ......................................................... 716/55

(58) Field of Classification Search ...................... 716/55
See application file for complete search history.

(56) References Cited

U.S. PATENT DOCUMENTS

| 6,781,701 B1 * | 8/2004 | Sweetser et al. ............... 356/521 |
| 8,122,385 B2 * | 2/2012 | Fukuhara et al. ............... 716/50 |
| 2004/0122636 A1 | 6/2004 | Adam |
| 2005/0191566 A1 | 9/2005 | Liu et al. |

OTHER PUBLICATIONS

Miller et al., "Analysis and modeling of photomask edge effects for 3D geometries and the effect on process window", Optical Microlithography XXII. Edited by Levinson, Harry J.; Dusa, Mircea V.. Proceedings of the SPIE, vol. 7274 (2009)., pp. 727424-727424-11 (Mar. 2009).*

* cited by examiner

*Primary Examiner* — Vuthe Siek
*Assistant Examiner* — Brandon Bowers
(74) *Attorney, Agent, or Firm* — The Noblitt Group, PLLC

(57) ABSTRACT

The disclosure concerns a method of simulating the image projected by a mask during photolithography including determining by a processor (702), taking into account the thickness of a masking layer of a mask, a near-field transmission amplitude curve of light passing through the mask across at least one pattern boundary in the initial mask layout; calculating by the processor, for each of a plurality of zones, average values of the curve; and simulating by a simulator (708) the image projected by the initial mask layout during the photolithography based on the average values.

14 Claims, 3 Drawing Sheets

SIMULATION OF THE IMAGE PROJECTED BY A MASK

FIELD OF THE INVENTION

The present invention relates to methods and apparatus for simulating the image projected by a mask during photolithography, generating a final mask layout, fabricating a mask based on the final mask layout and fabricating an integrated circuit using the mask.

BACKGROUND OF THE INVENTION

FIG. 1 illustrates a photolithography step involving a semiconductor wafer 2, having a light sensitive photo-resist 4 formed on it A mask 6 is positioned over the semiconductor wafer 2 and comprises a transparent plate 7 and opaque regions 8 on the underside of the plate 7 forming an image that is projected onto the photo-resist 4 during a photolithography step. The plate 7 is for example made of quartz, and the opaque regions 8 are formed for example of molybdenum silicide (MoSi). As represented in FIG. 1, light 10 is shone through the mask 6, and an image reducing lens 12 is used to make a reduction in the size of the image projected on the photo-resist 4, such that the dimensions of the image projected on the wafer are smaller than those of the mask. The mask layout is for example four times larger than the image formed on layer 4.

FIG. 2A illustrates in plan view the surface of the photo-resist 4. Dashed lines 202, 204 and 206 show mask pattern boundaries as reduced to correspond to the size of the projected patterns on the photo-resist 4, and solid lines 208, 210 and 212 show the actual patterns that are projected on the photo-resist layer 4, for example determined by simulation. The actual projected patterns are distorted with respect to the mask pattern edges. In particular, the rectangular regions are narrower, and tend to have curved corners or line end pull backs. This distortion results from some dispersion and interference on the light as it passes through the mask and through the optical arrangement between the mask and the wafer.

FIG. 2B illustrates, by dashed lines 214, 216 and 218, adjustments made to the boundaries of the mask patterns in order to result in more accurate patterns being formed on the wafer. The technique of adjusting the mask pattern boundaries in this way is known as optical proximity correction (OPC).

During OPC, a model for the transmission (amplitude and phase) of the light passing through the mask is used. The model for the transmission of light through the mask corresponds to the near-field amplitude and phase transmission just after the light has passed through the mask. The simulation of the image formed on the wafer takes into account other effects, such as the diffraction of the light and the aberrations introduced by the optical arrangement positioned between the mask and the wafer. A cut-off level is then applied to the simulated light intensities at the wafer level in order to determine the regions where the photo-resist will be developed.

As illustrated in FIG. 2B, the corrections to the patterns of the mask layout could comprise extending end regions to form "hammer heads", and thereby correct the pull back on line ends of the projected image. Generally, narrow openings on the mask are also made wider, such that in the image that is formed they have the desired width. Furthermore, concave inner corners of the mask pattern can be corrected by repositioning the mask pattern boundaries towards the interior of the corners, as shown by the feature labelled 222 in FIG. 2B.

When approximating the light transmission through the mask, the Kirchhoff approximation can be used, according to which the electric field is assumed to have a constant value for all points of the mask within a region of the same polarity. This implies that the percentage of light transmitted through the mask at a mask pattern boundary is assumed to be in the form of a step, for example equal to 100% where the mask is transparent, falling to around 6% where the mask is opaque. The Kirchhoff approximation implies a "Thin Mask" approximation (TMA) according to which it is assumed that the opaque layer 8 of the mask is infinitely thin. In other words, whereas the opaque layer 8 has certain thickness, labelled e in FIG. 1, it is assumed that this thickness is negligible.

The Kirchhoff approximation is adequate for some technologies down to the CMOS 65 nm and even 45 nm technologies nodes having smallest feature sizes of 65 nm or 45 nm respectively. As the illumination light is at a wavelength of 193 nm, even with a four-times reduction system, the feature sizes of CMOS 32 nm technology and below are smaller than this wavelength. Therefore, the 3D mask effects that are ignored by the Kirchhoff or thin mask model are no longer negligible.

As an alternative to the Kirchhoff approximation, a Domain Decomposition Method (DDM) has been proposed. This technique involves calculating near-field transmission amplitude and phase for some edges of the mask layout, based on a rigorous EMF (electromagnetic field) simulation, to determine a more realistic model of the 3D mask effects, whilst avoiding performing the full rigorous EMF calculation over the entire layout.

As shown in FIG. 3, assuming that the opaque layer of a mask has facing edges 300 and 302, the DDM method involves determining a first near-field curve 304 corresponding to the near-field transmission across the first edge 300, and then a second near-field curve 306 corresponding to the near-field transmission across the second edge 302. The same curves are generated for phase, and these curves may then be applied to all the edges of the mask having corresponding orientations. Curves are also determined for the two edges perpendicular to edges 300 and 302, thereby taking into account the polarization of the incident light. For unpolarized light, the modulus of the transverse electric and magnetic components $T_E$ and $T_M$ are equal, whereas for polarized light, one component can have a stronger modulus than the other. The complex amplitudes of the near-fields generated from each edge of the mask layout are then summed in order to calculate the near-field across the whole mask.

A problem with the DDM method is that it is computationally very demanding both in terms of runtime and memory usage. Assuming that sufficient memory can be provided, for a reasonably large and complex mask design, it may take hundreds of hours to perform OPC based on this model of the mask transmission amplitude and phase, whereas a corresponding calculation based on the Kirchhoff model may take only a few hours to perform.

There is a technical problem in generating a mask layout sufficiently accurately to cope with new CMOS technologies, while greatly reducing the computation time and complexity when compared to the DDM method.

SUMMARY OF THE PRESENT INVENTION

It is an aim of embodiments of the present invention to at least partially address one or more problems with current technology.

According to one aspect of the present invention, there is provided a method of simulating the image projected by a mask during photolithography comprising: determining by a processor, taking into account the thickness of a masking layer of a mask, a near-field transmission amplitude curve of light passing through the mask across at least one pattern boundary in the initial mask layout; calculating by said processor, for each of a plurality of zones, average values of said curve; and simulating by a simulator the image projected by said initial mask layout during said photolithography based on the average values.

According to an embodiment of the present invention, the method further comprises determining by said processor the points of inflection of said curve, wherein said plurality of zones is delimited based on said points of inflection across the pattern boundary.

According to an embodiment of the present invention, said plurality of zones comprise a boundary zone centered on the point of inflection corresponding to the pattern boundary, and first and second adjacent zones extending on each side of the boundary zone to the adjacent points of inflection.

According to an embodiment of the present invention, said curve is determined by a rigorous EMF (electromagnetic field) calculation.

According to an embodiment of the present invention, each average value is an amplitude A determined by the following equation:

$$A = \frac{\int_{-\infty}^{\infty} g(x) dx}{d}$$

where d is the width of the corresponding zone, and g(x) is a function equal to zero outside the corresponding zone and equal to said curve within the corresponding zone.

According to an embodiment of the present invention, determining said points of inflection comprises determining the second order derivative of said curve.

According to an embodiment of the present invention, the method further comprises: determining by the processor, taking into account the thickness of the mask layer of the mask, a near-field transmission phase curve of light passing through the mask across at least one pattern boundary in the initial mask layout; and calculating by said processor, for each of said plurality of zones, average values of said near-field transmission phase curve, wherein said simulation is performed based on said average amplitude and phase values.

According to an embodiment of the present invention, the method further comprises, after said calculation step, generating a model comprising said average amplitude values for each pattern boundary in said initial mask layout, said average values being assigned to zones around each pattern boundary.

According to a further aspect of an embodiment of the present invention, there is provided a method of generating a final mask layout comprising: simulating the image projected by an initial mask layout according to the above method; and correcting by said processor, based on said simulation, the initial mask layout to generate a final mask layout.

According to an embodiment of the present invention, said step of correcting the initial mask layout comprises comparing the simulated image with a memorized image and iteratively correcting the initial mask layout based on said comparison.

According to a further aspect of an embodiment of the present invention, there is provided a method of fabricating a mask to be used during photolithography comprising: generating a final mask layout according to the above method; and fabricating said mask in accordance with said final mask layout.

According to an embodiment of the present invention, fabricating said mask comprises depositing a uniform layer of opaque material over a transparent plate.

According to a further aspect of an embodiment of the present invention, there is provided a method of fabricating an integrated circuit comprising: fabricating a mask according to the above method; depositing a photo-resist layer over a portion of said integrated circuit; and performing photolithography of said photo-resist layer using said mask.

According to a further aspect of the present invention, there is provided an apparatus comprising: a processor adapted to: determine, taking into account the thickness of a masking layer of a mask, a near-field transmission amplitude curve of light passing through the mask across at least one pattern boundary in the initial mask layout; calculate, for each of a plurality of zones delimited based on said points of inflection across the pattern boundary, average values of said curve; and a simulator adapted to simulate the image projected by said initial mask layout during photolithography based on the average values.

According to an embodiment of the present invention, the processor is further adapted to correct, based on said simulation, the initial mask layout to generate a final mask layout, and further comprising a unit adapted to form said mask in accordance with said final mask layout.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

DETAILED DESCRIPTION OF EMBODIMENTS OF THE PRESENT INVENTION

Figure 4A:
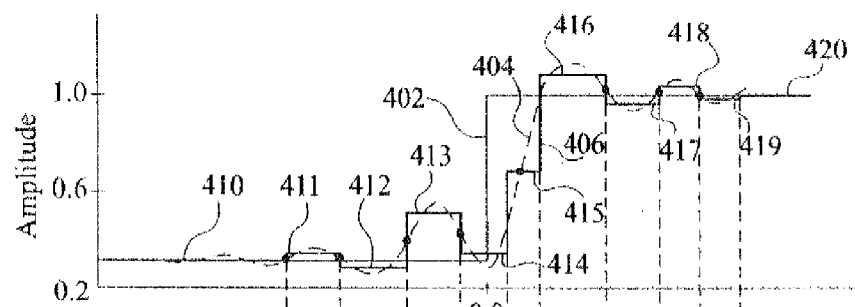
FIGS. 4A and 4B show curves for near-field transmission amplitude and phase approximations according to an embodiment of the present invention.
Figure 4B:
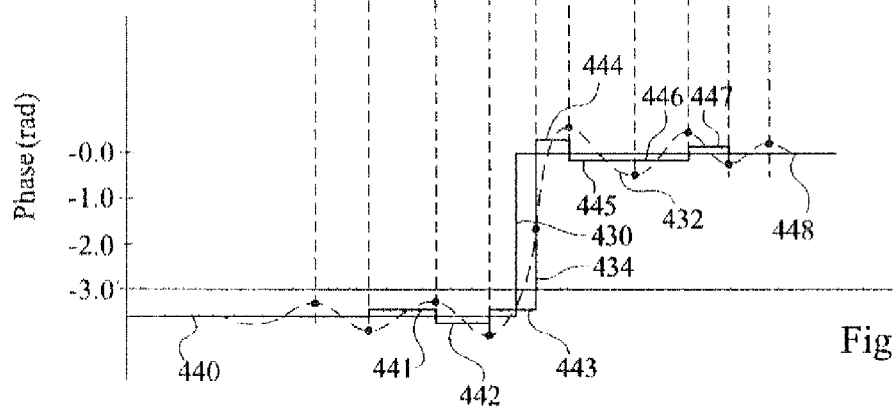

FIGS. 4A and 4B show curves of estimations of near-field transmission amplitude and phase respectively resulting from a pattern boundary of the mask at position 0.0 in the middle of the x axis in each figure.

In FIG. 4A, the curve 402 illustrates a near-field transmission approximation based on the Kirchhoff model, according to which the near-field transmission amplitude corresponds to a step function at the pattern boundary. To the left of the step, the opaque part of the mask is present, and the near-field transmission amplitude is assumed to be at a constant low value, for example around 6%. To the right of the step, the transparent region of the mask is present, and the near-field transmission amplitude is assumed to be at a high value of around 100%.

The dashed curve 404 illustrates the near-field around the pattern boundary based on a rigorous EMF simulation, based on the actual thickness of the opaque layer of the mask. As illustrated, due to the thickness of opaque layer of the mask, the near-field transmission amplitude oscillates across the pattern boundary with a series of peaks and troughs. Thus, whereas according to the Kirchhoff approximation the near-field transmission increases just to the right of the mask pattern boundary, in reality the increase occurs further into the transparent region.

The solid curve 406 having multiple levels illustrates an example of an approximation of the near-field transmission amplitude across the pattern boundary. The curve comprises multiple discrete levels, as opposed to the two levels of the Kirchhoff approximation, or the continuous curve 404 based on the rigorous EMF simulation. The curve 406 corresponds to a quantization of the continuous curve 404, and leads to a multi-level model. The term "multi-level" is used herein to designate models having three or more distinct levels, as opposed to the models based on the Kirchhoff approximation, which have just two distinct levels. In the multi-level model, there may be up to 20 levels for isolated structures, or 3 levels for dense structures. This multi-level approach can be considered as a modified Kirchhoff approach, in that each level is effectively similar to a Kirchhoff or thin mask model in that it comprises zones of uniform amplitude and phase. However, the near-field amplitude and phase of each level is different.

FIG. 4A provides an example of the levels, a first low level on the left labelled 410 corresponding for example to the Kirchhoff level for the opaque region of the mask where the near-field transmission amplitude is at around 6%, a series of levels 411 to 414 up to the pattern boundary corresponding to average transmission amplitudes for each peak and trough of the EMF curve 404, a level 415 at the transition of the EMF curve from low to high due to the pattern boundary, and a series of levels 416 to 419 corresponding to the average transmission amplitudes for each of a further number of peaks and troughs of the EMF curve to the right of the pattern boundary. A level 420 on the right corresponds to the Kirchhoff level for the transparent region of the mask where the near-field transmission is close to 100%.

The levels are generated based on the EMF curve by dividing the EMF curve into sections. Each section is assigned a corresponding level, which is calculated based on near-field transmission amplitude that maintains the same energy as the initial curve.

The sections are for example determined based on the points of inflection of the curve, at which the curvature changes sign. The inflection points in FIG. 4A are shown by black dots, and can be determined from the curve by for example determining the second order derivative. Whereas the sections generally correspond to zones between pairs of inflection points, in the case of the inflection point marking the amplitude swing corresponding to the pattern boundary, a level 415 is provided at this point, extending half-way to the adjacent trough and peak, from where the adjacent levels 414 and 416 start. Thus the three sections 414-416 are provided between three adjacent inflection points.

Figure 4C:
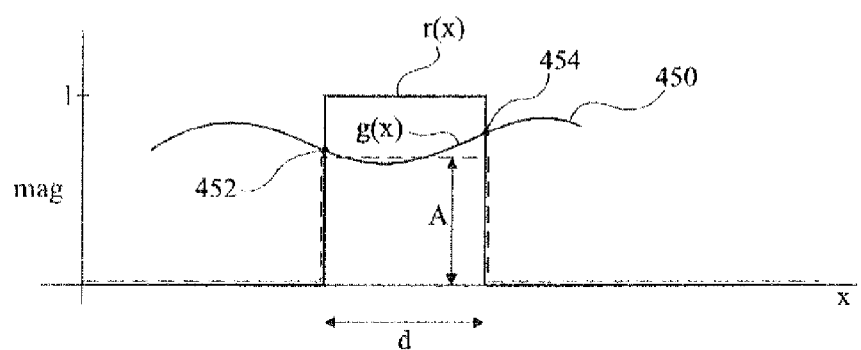
FIG. 4C illustrates part of a near-field transmission curve.

The curve of FIG. 4C illustrates a portion of an EMF curve 450 between a pair of inflection points 452 and 454. The amplitude of the level for the portion of the EMF curve between the inflection points can be determined based on Parseval's theorem, by conservation of the total signal energy, for example based on the following equation:

$$A = \frac{TF\{g(x)\}(X = 0)}{TF\{r(x)\}(X = 0)}$$

where g(x) is a function equal to zero outside the inflection points and equal to the EMF curve between the inflection points, r(x) is the rectangular function equal to zero outside the inflection points and equal to 1 between the inflection points, TF{ } is the Fourier transform, X represents the spatial frequency domain and is selected as equal to 0, and A is the ratio between the energy of g(x) and the energy of r(x), which provides the amplitude of the level.

The Fourier transform of f(x) can be written as:

$$TF\{f(x)\}(X) = \int_{-\infty}^{+\infty} f(x)e^{-i2\pi xX}dx$$

Thus, TF{g(x)} (X=0) can be defined as:

$$TF\{g(x)\}(X = 0) = \int_{-\infty}^{\infty} g(x)dx$$

Also, (TF{r(x)} (X=0) can be defined as:

$$TF\{r(x)\}(X = 0) = \int_{-\infty}^{\infty} r(x)dx = d$$

where d is the width between the pair of inflection points.

Thus the amplitude A can be determined as:

$$A = \frac{\int_{-\infty}^{\infty} g(x)dx}{d}$$

The amplitude of each of the levels between the inflection points in FIG. 4A is for example determined based on the example of FIG. 4C.

FIG. 4B illustrates a similar approximation for the near-field phase shift caused by the mask across the pattern boundary. The y axis shows the phase shift in radians.

Again, a curve 430 illustrates the Kirchhoff approximation having a step at the pattern boundary. To the left of the pattern boundary, the near-field phase shift is at a constant level of around $-\pi$ radians, while to the right of the pattern boundary the near-field phase shift is at a constant level of close to zero.

A dashed line 432 shows the curve determined based on a rigorous EMF calculation, and a solid line 434 illustrates a multi-level approximation comprising discrete levels determined based on the EMF curve in a similar fashion to the levels of curve 406 described above. However, rather than the levels corresponding to sections between inflection points of the phase curve, the same spatial limits as for the levels 410 to 420 are for example used.

The levels of the multi-level approximation 434 in the example of FIG. 4B comprise a level 440 representing a phase shift corresponding to the Kirchhoff level to the left of the pattern boundary. Across the pattern boundary, the seven levels 441 to 447 are provided from left to right corresponding spatially to the sections 412 to 418 of FIG. 4A respectively. A level 448 further to the right of the pattern boundary has a value corresponding to the Kirchhoff level to the right of the pattern boundary, in other words approximately zero.

The values of the levels 441 to 447 of FIG. 4B are for example determined based on Parseval's theorem, as described above with reference to FIG. 4C, based on the average values within each section.

Figure 5:
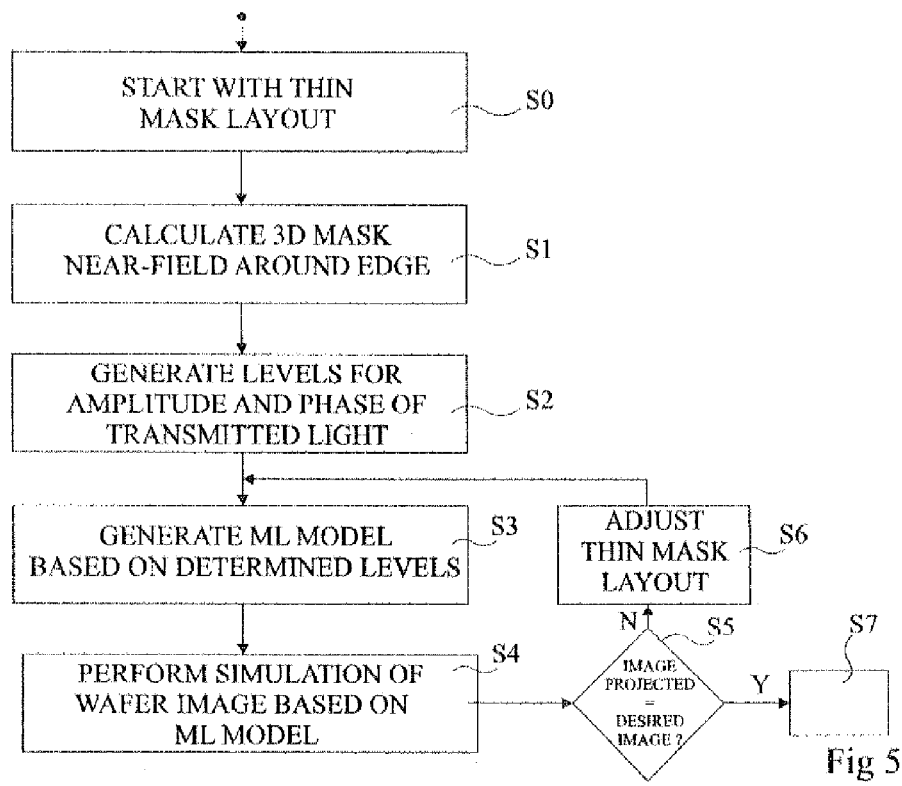
FIG. 5 illustrates steps in a method for estimating 3D mask effects and generating a mask layout according to embodiments of the present invention.

FIG. 5 illustrates steps in a method of determining a multi-level model for 3D mask effects and generating a mask layout based on this model.

In a first step S0, a thin mask layout is provided in a format known in the art for mask layout representation, such as in the format GDSII™, or in the format OASIS™.

The thin mask layout comprises just two levels: a first level corresponding to regions where the mask is transparent is defined for example by a near-field transmission of 100%; and a second level corresponding to regions where the mask is opaque is defined for example by a near-field transmission of around 6%, and a phase shift of around $+/-\pi$ radians with respect to the first level.

Next, in step S1, the near-field transmission amplitude and phase curves at a boundary of a thin mask pattern are calculated based on a rigorous EMF calculation. This may for example be performed by an application that solves Maxwell's equations for a given mask geometry, taking into account the thickness and properties of the material forming the mask. Boundary and incident conditions are determined by appropriate numerical methods such as FDTD (finite difference time domain), RCWA (rigorous coupled wave analysis) etc. The rigorous calculation of the near-field amplitude and phase is for example implemented at the pattern boundary for the two components $T_E$ and $T_M$ of the electric field.

In the next step S2, a plurality of levels is generated to correspond to the near-field transmission amplitude and phase curves across the pattern boundaries. As described above, this for example comprises determining levels between pairs of inflection points of the curves close to the pattern boundaries.

In a next step S3, a multi-level (ML) near-field model is generated based on levels determined in step S2. For example, the levels for each of the x and y direction pattern boundaries are applied to all the mask boundaries throughout the thin mask layout. The format of the multi-level near-field model is for example the same as for the mask layout, such as the computer aided design format GDSII or OASIS CAD, but comprises a multitude of zones each of which is represented by one of at least three particular values of amplitude and phase.

In the next few steps, optical proximity correction (OPC) is performed to iteratively adapt the thin mask layout based on simulation of the light intensity on the plate.

In particular, in a step S4, a simulation is performed based on the multi-level near-field models of transmission amplitude and phase introduced by the mask, to determine the layout of the projected image.

Next, in step S5, the layout of the projected image is compared to the desired layout, and if they do not match to within a given tolerance, this implies that the pattern boundaries need some modification. The particular tolerance will depend on device requirements, and thus the technology and mask layer concerned. The tolerance can for example be as small as one correction grid unit, which is limited by mask manufacturing constraints.

Figure 1:
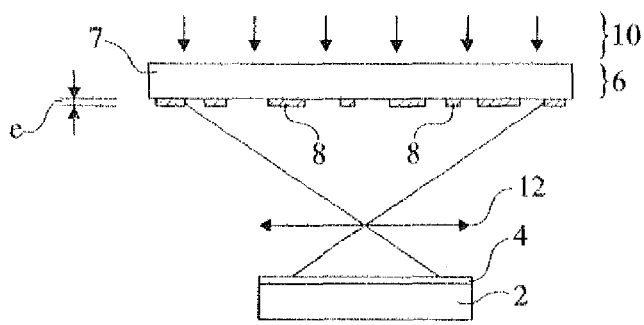
FIG. 1 (described above) shows a photolithography step.
Figure 2A:
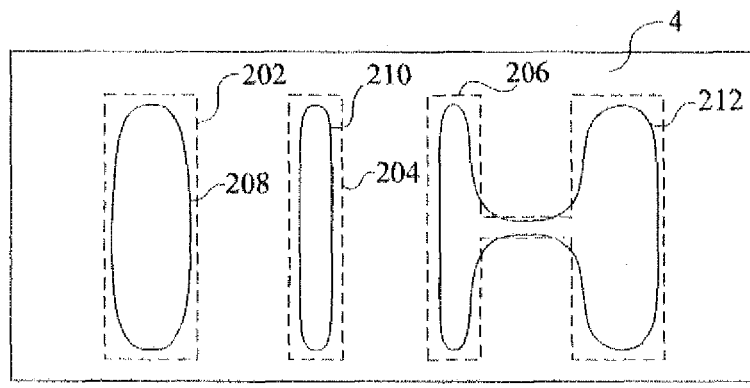
FIGS. 2A and 2B (described above) illustrate mask patterns and corresponding image projections.
Figure 2B:
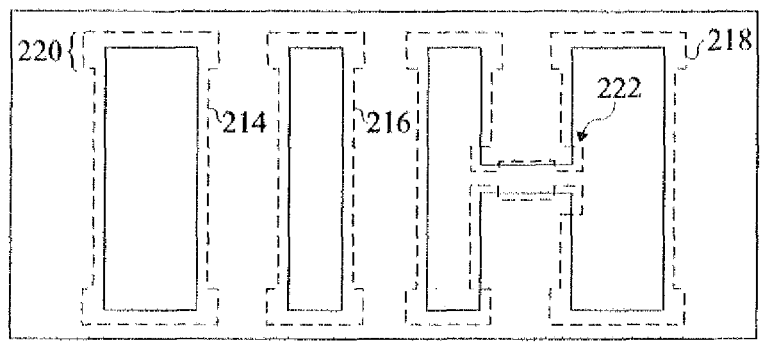
Figure 3:
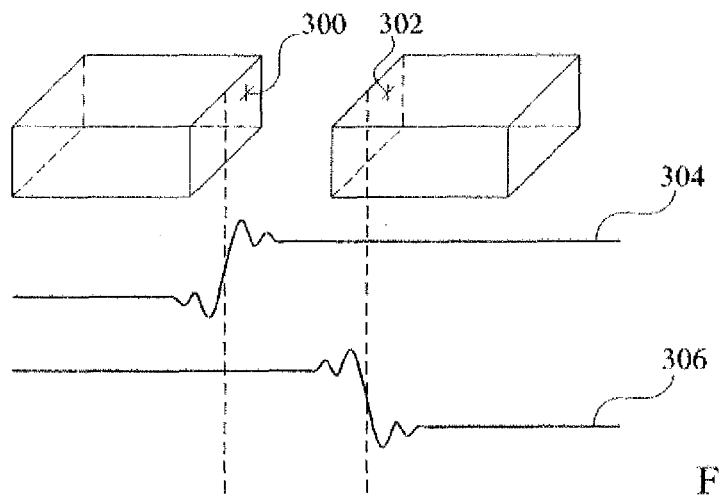
FIG. 3 (described above) illustrates a domain decomposition method (DDM) for estimating 3D mask effects.

If the layout of the simulated image does not match that of the desired layout, the next step is S6, in which one or more pattern boundaries in the thin mask layout are adjusted. For example, adjustments similar to those shown in FIG. 2B can be made.

After step S6, steps S3, S4 and S5 are repeated. If in step S5 the layout of the projected image corresponds to the desired layout to within the given tolerance, the next step is S7, in which the updated mask layout can be used to fabricate the mask to be used for the photolithography.

Fabrication of the mask for example involves depositing a layer of MoSi over a quartz plate, and then etching it according to a determined layout. The thickness of MoSi is for example determined such that a thickness of 65 nm gives a phase shift of 180°, and a uniform transmission of 6%.

Figure 6:
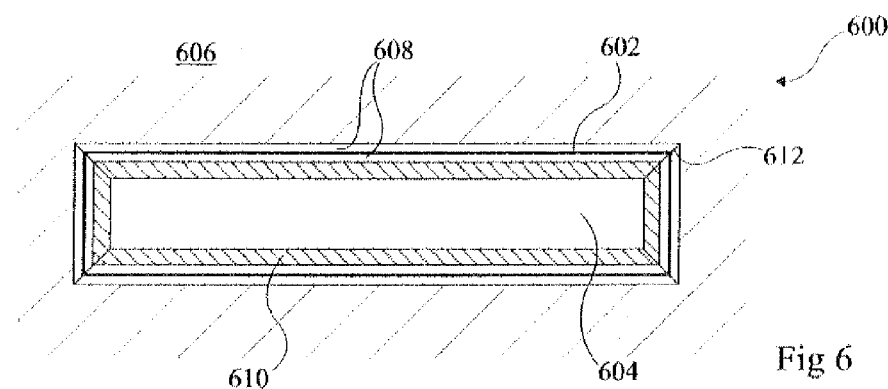
FIG. 6 illustrates an example of a model for near-field transmission amplitude of a mask pattern according to embodiments of the present invention.

FIG. 6 illustrates an example of a multi-level model 600 determined based on the above method.

As illustrated, in this example there is a rectangular pattern boundary 602, delimiting a transparent region. The central zone 604 of the transparent part has a transmission of close to 100% for 193 nm wavelength light. The outer zone 606 of the opaque region has a transmission of this light of around 5%. A number of zones 608 and 610 around the pattern boundary 602 have different levels of transmission amplitude, as will now be described.

The zone 608 extends on both sides of the pattern boundary 602, and for example corresponds to the level 414 of FIG. 4A. The zone 610 extends between the zone 608 and the inner region 604, and for example corresponds to level 415 of FIG. 4A.

The pattern boundary in the x direction is for example associated with zones of different amplitude and phase with respect to those of the pattern in the y direction. Generally, the amplitude and phase values are determined for both polarizations $T_E$ and $T_M$, which are respectively associated with the x and y directions. The interface between the zones is for example made diagonally, as represented by line 612.

The multi-level model of FIG. 6 is used during OPC simulation to adapt the positioning of the pattern boundaries in the mask layout, as will now be described with reference to the apparatus of FIG. 7.

Figure 7:
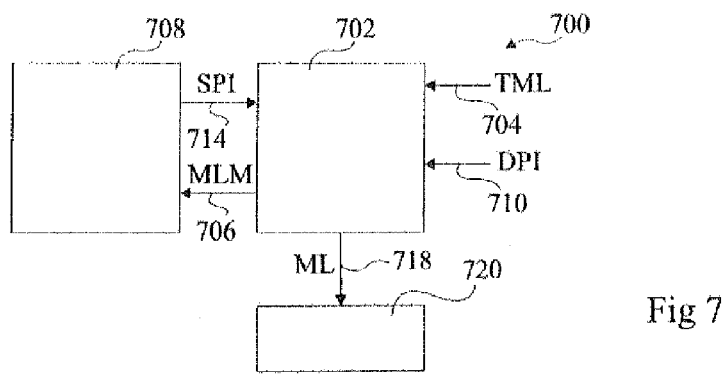
FIG. 7 illustrates apparatus for generating a mask layout according to embodiments of the present invention.

FIG. 7 illustrates an apparatus 700 arranged to generate models for near-field transmission amplitude and phase shift resulting from a mask layout, and to perform OPC simulations to adapt the mask layout, based on the generated models, to image requirements such that it can be used in a photolithography step.

Apparatus 700 comprises a processing block 702, capable of receiving a thin mask layout (TML) on input line 704 representing the layout using two levels, for example based on the Kirchhoff model, which assumes the mask has no thickness. The processing block 702 is adapted to determine, for at least one edge of a pattern of the thin mask, one or more levels to be applied to zones across one or more pattern boundaries based on the 3D mask effects, and to generate multi-level models MLM for the near-field transmission amplitude and optionally phase on an output line 706 to a simulation block 708.

The simulation block 708 is arranged to simulate a projected image based on the multi-level models, and to provide a resulting simulated projected image (SPI) on a line 714 to the processing block 702.

Processing block 702 compares the simulated projected image with a desired projected image (DPI), provided on an input line 710. Based on this comparison, the processing block 702 adapts one or more pattern boundaries of the thin mask layout, and generates new multi-level models for near-field transmission amplitude and phase based on the modified thin mask layout.

The new multi-level models are provided again to simulation block 708 for simulation, and again the simulated projected image is compared to the desired projected image, by processing block 702. This process repeats until the comparison is favourable. Then the thin mask layout corresponding to the successful simulation is used to generate a mask layout (ML) having the determined boundaries, and this layout is provided on an output line 718 to a mask generation block 720, which is for example arranged to deposit an opaque layer of the determined layout over a quartz plate, in order to generate the mask that can be used for a subsequent photolithography.

A benefit of the method and apparatus described herein is that the mask layout may be generated that takes into account 3D effects of the mask without excessive demands on processing power and computation time.

While a number of specific embodiments have been described, it will be apparent to those skilled in the art that variations may be applied.

For example, the calculation of the average levels of the transmission amplitude and phase of the mask may be calculated based on Parseval's theorem, or by other methods. The amplitude and phase levels may be determined for example based on the inflection points.

Furthermore, it will be apparent to those skilled in the art that a different number of levels can be chosen based on the effect that these have on the transmission amplitude and phase at the boundaries in the mask with respect to the Kirchhoff levels.

While examples of masks having opaque regions with 6% transmission amplitude have been provided, the method and apparatus described herein could be applied to masks with opaque regions of different transmission amplitudes.

Furthermore, the present method may be used to generate a model for near-field amplitude levels alone, and the near-field phase levels can be determined by a different technique, or not at all in the case of masks with no phase shift. For example, binary or near binary masks having a transmission amplitude of between 1 and 3% in opaque regions could be considered to have no phase shift.

In the method of FIG. 5, it would be possible to initially skip steps S1, S2 and S3 and perform the first one or more iterations based on the thin mask model for near-field transmission, in order to achieve a quick convergence, before the multi-level approach is used to provide the desired accuracy in the mask layout.

The invention claimed is:

1. A method of simulating the image projected by a mask during photolithography comprising:
   determining by a processor, taking into account the thickness of a masking layer of the mask, a near-field transmission amplitude curve of light passing through the mask across at least one pattern boundary in the initial mask layout;
   calculating by said processor, for each of a plurality of zones, average values of said curve, wherein each average value is an amplitude A determined by the following equation:

$$A = \frac{\int_{-\infty}^{\infty} g(x)dx}{d}$$

where d is the width of the corresponding zone, and g(x) is a function equal to zero outside the corresponding zone and equal to said curve within the corresponding zone; and
   simulating by a simulator the image projected by said initial mask layout during said photolithography based on the average values.

2. The method of claim 1, further comprising determining by said processor the points of inflection of said curve, wherein said plurality of zones is delimited based on said points of inflection across the pattern boundary.

3. The method of claim 2, where said plurality of zones comprise a boundary zone centered on the point of inflection corresponding to the pattern boundary, and first and second adjacent zones extending on each side of the boundary zone to the adjacent points of inflection.

4. The method of claim 1, wherein said curve is determined by a rigorous electromagnetic field calculation.

5. The method of claim 2, wherein determining said points of inflection comprises determining the second order derivative of said curve.

6. The method of claim 1, further comprising:
   determining by the processor, taking into account the thickness of the masking layer of the mask, a near-field transmission phase curve of light passing through the mask across at least one pattern boundary in the initial mask layout; and
   calculating by said processor, for each of said plurality of zones, average values of said near-field transmission phase curve, wherein said simulation is performed based on said average amplitude and phase values.

7. The method of claim 1, further comprising, after said calculation step, generating a model comprising said average amplitude values for each pattern boundary in said initial mask layout, said average values being assigned to zones around each pattern boundary.

8. The method of claim 1, further comprising:
   correcting by said processor, based on said simulation, the initial mask layout to generate a final mask layout.

9. The method of claim 8, wherein said step of correcting the initial mask layout comprises comparing the simulated image with a memorized image and iteratively correcting the initial mask layout based on said comparison.

10. The method of claim 8, further comprising:
    fabricating a photolithography mask in accordance with said final mask layout.

11. The method of claim 10, wherein fabricating said photolithography mask comprises depositing a uniform layer of opaque material over a transparent plate.

12. The method of claim 10, further comprising:
    depositing a photo-resist layer over a portion of an integrated circuit; and
    performing photolithography of said photo-resist layer using said photolithography mask.

13. An apparatus comprising:
    a processor adapted to:
       determine, taking into account the thickness of a masking layer of a mask, a near-field transmission amplitude curve of light passing through the mask across at least one pattern boundary in the initial mask layout;
       calculate, for each of a plurality of zones delimited based on points of inflection of the curve across the pattern boundary, average values of said curve, wherein each average value is an amplitude A determined b the following equation:

$$A = \frac{\int_{-\infty}^{\infty} g(x)dx}{d}$$

where d is the width of the corresponding zone, and $g(x)$ is a function equal to zero outside the corresponding zone and equal to said curve within the corresponding zone; and a simulator adapted to simulate the image projected by said initial mask layout during photolithography based on the average values.

14. The apparatus of claim 13, wherein the processor is further adapted to correct, based on said simulation, the initial mask layout to generate a final mask layout, and further comprising a unit adapted to form a photolithography mask in accordance with said final mask layout.

* * * * *

UNITED STATES PATENT AND TRADEMARK OFFICE
CERTIFICATE OF CORRECTION

PATENT NO. : 8,423,927 B2
APPLICATION NO. : 12/839817
DATED : April 16, 2013
INVENTOR(S) : Saied et al.

It is certified that error appears in the above-identified patent and that said Letters Patent is hereby corrected as shown below:

In column 6, line 30 in the specification, please remove "(" before "TF";

In the Claims:

In column 11, claim 3, line 1, please delete "b" and insert --by--.

Signed and Sealed this
Twenty-first Day of May, 2013

Teresa Stanek Rea
*Acting Director of the United States Patent and Trademark Office*